United States Patent [19]

Hekimian et al.

[11] 3,961,264

[45] June 1, 1976

[54] LINEAR FREQUENCY CONVERTER WITH GAIN INDEPENDENT OF CIRCUIT PARAMETERS

[75] Inventors: Norris C. Hekimian, Rockville, Md.; Walter Mack, Falls Church, Va.

[73] Assignee: Hekimian Laboratories, Inc., Rockville, Md.

[22] Filed: May 2, 1974

[21] Appl. No.: 466,459

[52] U.S. Cl. .................................. 325/451; 321/60
[51] Int. Cl.² ........................................ H04B 1/28
[58] Field of Search ........... 325/434, 438, 439, 430, 325/449–451, 442, 431, 435, 363; 329/101, 103, 163, 164; 330/15; 321/60, 61, 4.8 R, 16; 332/16 R, 16 T, 24, 43 R, 43 B; 328/156; 324/77 A, 77 D, 77 E

[56] References Cited
UNITED STATES PATENTS

| | | |
|---|---|---|
| 3,581,222 | 5/1971 | Dunwoodie.......................... 325/451 |
| 3,628,154 | 12/1971 | Weill.................................... 325/435 |
| 3,646,458 | 2/1972 | Verhoeven et al. ................. 329/101 |
| 3,863,136 | 1/1975 | Hanson............................ 325/451 X |

*Primary Examiner*—Benedict V. Safourek
*Assistant Examiner*—Robert Hearn
*Attorney, Agent, or Firm*—Rose & Edell

[57] ABSTRACT

A frequency converter circuit includes an input voltage-to-current converter which delivers signal current to a tuned IF circuit via a current steering circuit controlled by a local oscillator. In a preferred embodiment voltage-to-current conversion is effected without introducing unwanted harmonics by a double-gate MOSFET. Current steering is performed by a pair of push-pull connected transistors alternately driven into saturation by the local oscillator so that they alternately deliver signal current to the tank circuit in opposite senses. A current-limited diode clamps the output signal level in response to high input current levels to prevent over-driving an output filter.

8 Claims, 2 Drawing Figures

LINEAR FREQUENCY CONVERTER WITH GAIN INDEPENDENT OF CIRCUIT PARAMETERS

BACKGROUND OF THE INVENTION

The present invention relates to frequency converters and, more particularly, to a frequency converter which does not introduce unwanted harmonics, which is capable of driving a filter having a limited input signal handling capability, and which is unaffected by the parameters of active circuit elements.

Frequency converter circuits are often required to operate in the presence of one or more unfavorable conditions which fully test the mettle of the circuit designer. In some applications, however, circuit design virtually becomes enigmatic. One such application is the measurement of intermodulation distortion introduced in a communications channel. In a particular intermodulation distortion test set described herein, a frequency converter is required to provide an intermediate frequency (IF) signal in response to discrete input tones which are to be mixed with a local oscillator frequency residing very close to the output IF. The conditions imposed upon the frequency converter by the system are: (1) the output IF signal must not exceed −10 dbm in order not to overdrive the output IF filter; (2) the circuit gain must be independent of the parameters of active elements in the circuit; (3) the signal frequencies are much lower than the output IF requiring that the local oscillator frequency be relatively close to the IF and therefore presenting the danger that the converter will be overdriven; and (4) the possibility of generating undesired harmonics of the input signal must be eliminated.

It is an object of the present invention to provide a frequency converter capable of operating within the framework of th foregoing enumerated conditions.

SUMMARY OF THE INVENTION

In accordance with the present invention a frequency converter circuit employs a double gate MOSFET to convert input voltage to a proportional current, the natural characteristics of the MOSFET assuring that a minimal amount of odd ordered distortion products of the input signal frequencies are generated. The signal current is AC-coupled to the emitters of a pair of push-pull-connected transistors driven in a current steering mode by a local oscillator signal. Collector bias for the transistors is applied via a current-limited diode which limits the output signal amplitude only for high level input currents. The transistors drive a tank circuit which is tuned to the output IF. The current-steering operation of the transistors assures that the transistor gain factors do not affect circuit operation. The current-limited diode prevents overdriving the output circuitry but permits linear operation to ensue within the desired range of input signal levels.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein.

DESCRIPTION OF PREFERRED EMBODIMENTS

Figure 1:
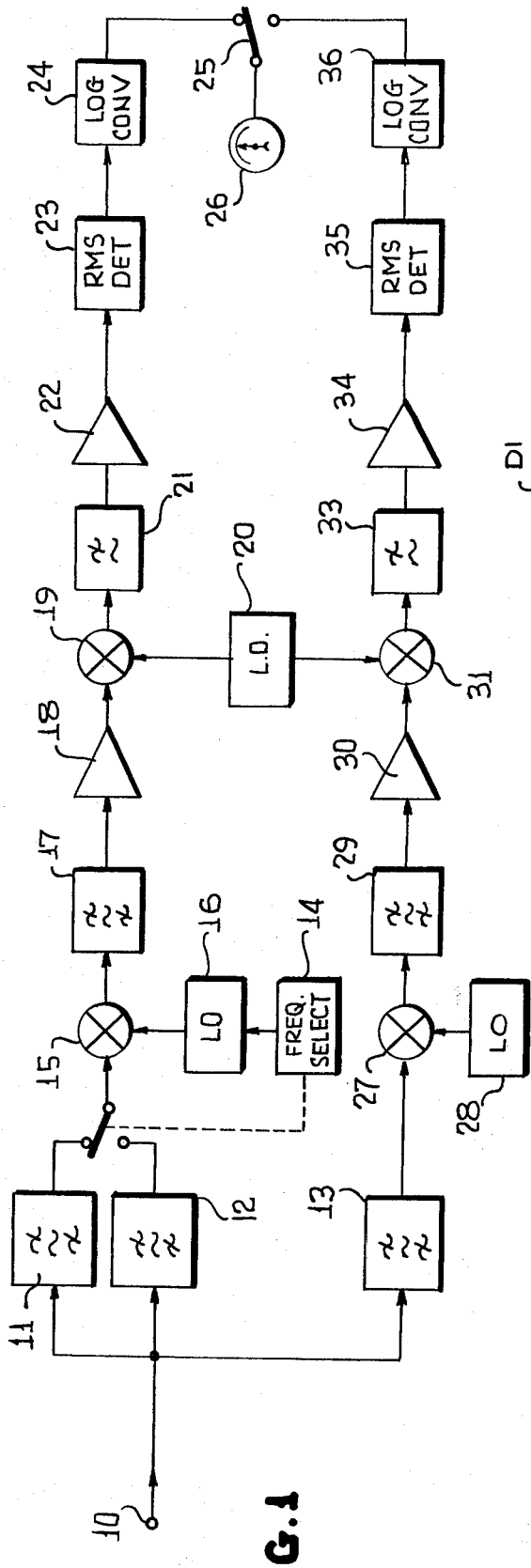
FIG. 1 is a functional block diagram of an intermodulation distortion test set employing the frequency converter of the present invention.

Referring specifically to FIG. 1 of the accompanying drawings, there is illustrated an intermodulation distortion test set of the type utilized to monitor the intermodulation distortion characteristics of a communications channel or portion thereof. The particular test set under consideration herein is the type manufactured by Hekimian Laboratories, Inc. of Rockville, Md., under the designation Model 76. That test set inclues circuitry (not shown) for generating three test tones which are at frequencies corresponding to unused slots in a multi-channel frequency multiplexed communications system. The three tones are applied to the channels or other equipment under test and then received at terminal 10 of circuitry in FIG. 1. The signal thus received includes anything appearing on the channels, including the three test tones and any intermodulation distortion products of these tones introduced by the channels or equipment under test. It should also be noted, that since these three test tones correspond to frequencies which are not in use in the channels under test, the intermodulation distortion tests can be made while the channels are in normal service (that is, carrying communications signal in each of the various channels under normal operating conditions). In fact, the three tone approach to intermodulation test is suitable for in-service utilization on a standard 1800 channel system. For the standard CCITT 1800 channel frequency designation scheme, numerous test tone frequencies may be employed. For purposes of the system being described, the three test tones are as follows: $F1 = 297$ KHz; $F2 = 8.259$ MHz; and $F3 = 8.853$ MHz.

Since the signal applied to input terminal 10 carries not only the intermodulation distortion products of the test tones as produced by the channels under test, but also any communication signals appearing on the channels under test, bandpass filters 11, 12 and 13 are employed to separate out the desired intermodulation and distortion components. Specifically, filter 11 is tuned to 8.84 MHz with a bandwidth of 1.188 MHz. This allows the passage of the 8.556 MHz $F_2+F_1$ and $F_3-F_1$ second order intermodulation products, the 9.447 MHz $2F_3-F_2$ and $F_3+2F_1$ third order intermodulation products and the $F_2$ and $F_3$ test signals for monitor purposes. Bandpass filter 12 is tuned to the $F_1$ test signal frequency and provides the distortion analyzer with the measurement capability of this frequency for monitor purposes. Filters 11 and 12 are in what is called the high frequency test path of the intermodulation distortion analyzer; that is, these filters are part of a circuit which monitors intermodulation distortion at the high end of the frequency spectrum used by the channels under test. The inclusion of the $F_1$ measurement capability is a matter of convenience. Filter 13 is in the low frequency distortion test path and is tuned to 594 KHz which corresponds to second order intermodulation products $2F_1$ and $F_3-F_2$.

Referring first to the high frequency test circuitry, a frequency select circuit 14 automatically connects the output signal from either filter 11 or filter 12 to a mixer or frequency converter 15. The selection of the appropriate filter output signal depends upon whether or not the $F_1$ test signal is being measured. A local oscillator circuit 16 provides any of five local oscillator output frequencies under the control of the frequency select circuit 14. The proper input filter 11 or 12 is selected in accordance with whichever local oscillator frequency is chosen to provide an output signal at the same intermediate frequency (IF) in any case. For the particular equipment under consideration, this intermediate frequency is 10.7 MHz.

The IF signal provided by mixer 15 is passed through bandpass filter 17 which is tuned to the IF output signal from the mixer. The signal passed by filter 17 is amplified by amplifier 18 and converted down to audio frequency range by the combined action of mixer 19 and local oscillator 20, and the resulting output signal from mixer 19 is passed through low pass filter 21 and amplifier 22 to the measurement circuitry.

The measurement circuitry includes an RMS detector circuit 23 which provides an output voltage at a level corresponding to the RMS value of the output signal from amplifier 22. A further signal having an amplitude corresponding to the logarithm of the RMS signal is derived by log converter 24 and applied via meter selection switch 25 to a meter 26. The desired intermodulation distortion is thus monitored at meter 26 by the operator.

In like manner intermodulation distortion at the low frequency end of the channel is measured with the aid of filter 13, the signal from which is applied to mixer 27. A local oscillator 28 applies the appropriate signal to mixer 27 so that the signal frequency is converted to the standard IF signal which is then passed by bandpass filter 29. The IF signal from filter 29 is amplified by amplifier 30 and mixed with the output signal from local oscillator 20 at mixer 31 to down convert the IF signal to the audio range. The audio signal is passed by low pass filter 33 and is amplified by amplifier 34. Another RMS detector circuit 35 and log converter circuit 36 are provided to deliver a signal suitable for measurement to meter 26 via meter select switch 25.

The present invention deals with the circuitry employed in frequency converters or mixers 15 and 27. The presence of mixers in an intermodulation distortion measurement system places a number of stringent operating requirements on the mixers. One of these requirements concerns limiting the output power from the mixer. Specifically, filters 17 and 29 are preferably crystal filters which provide a relatively narrow passband at relatively low cost. However, the desired bandpass characteristics of the filter are valid for only very low input power levels. For example, it is common for power levels above −20 dBm to render the characteristics of the filter unpredictable. Also, power levels substantially greater than 0 dBm can permanently degrade the filter performance. Under such circumstances, it is important to limit the output signal provided by the mixers to this power level or less.

It is also important for the gain of mixer circuits 15 and 27 to be independent of the parameters of the active elements in the circuit. In other words, the overall gain of mixer 15 (and mixer 27) must be stable for varying operating conditions, including temperature.

Another important consideration relates to the fact that the local oscillator frequency for mixer 27 is relatively close to the intermediate frequency of the mixer output signal. The danger here resides in the fact that any circuit in the mixer which is tuned to the IF has a resonant frequency which is not that far separated from the local oscillator frequency. As a consequence there is a danger of unduly large amplitude signals being generated.

One other consideration which is particularly important for a mixer employed in an intermodulation distortion test set is the fact that the mixer must be extremely linear; that is, there should be no harmonics of the input signal frequencies generated in the mixer circuit. Such unwanted harmonics could adversely affect the measurement of distortion produced by the channel under test.

Figure 2:
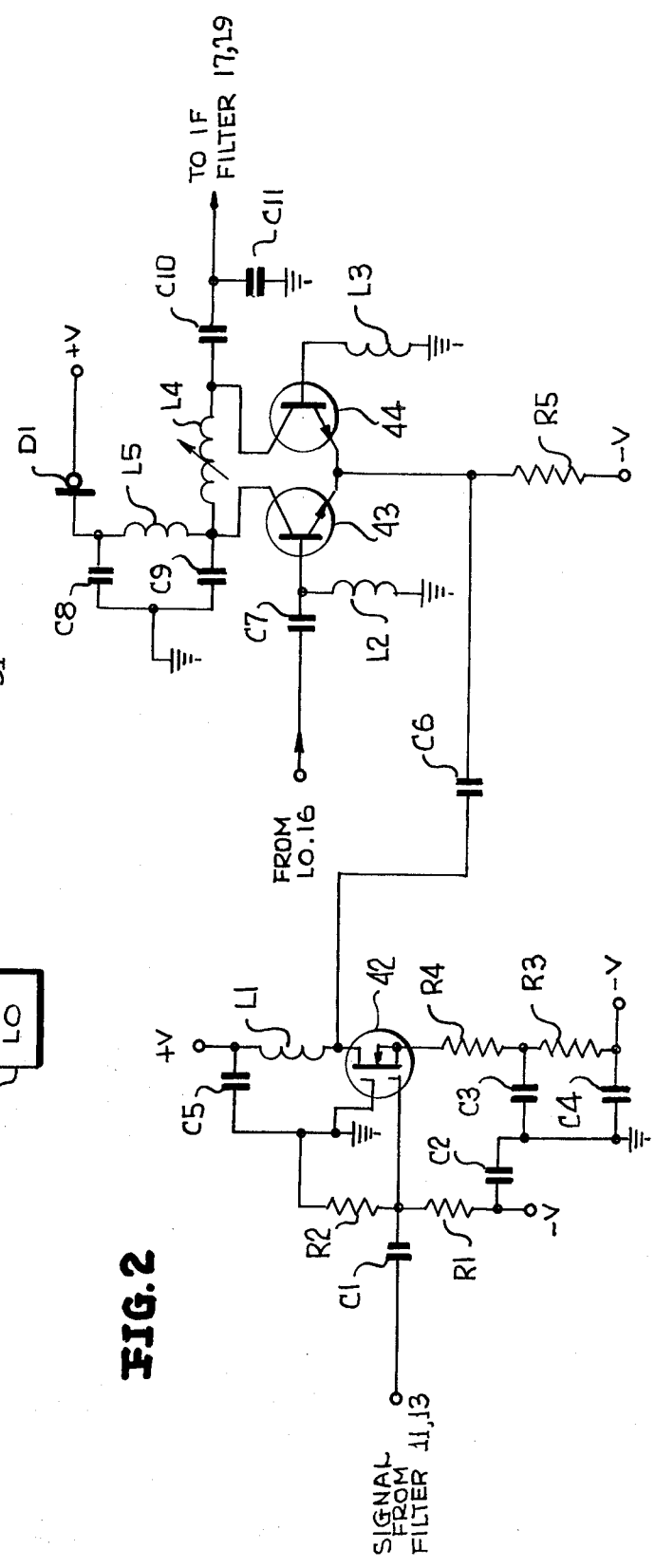
FIG. 2 is a schematic diagram of a preferred embodiment of the frequency converter of the present invention.

A frequency converter or mixer circuit which operates satisfactorily under all of the foregoing conditions is illustrated in FIG. 2 of the accompanying drawings. The input signal, which can be derived from any of filters 11, 12 or 13, is AC-coupled via capacitor C1 to one gate electrode of a double-gate MOSFET 42. The other gate electrode of the MOSFET is grounded. A voltage divider circuit comprising resistors R1 and R2 is connected between negative supply voltage −V and ground and provides suitable biasing for the ungrounded gate electrode. The source electrode of MOSFET 42 is coupled to negative voltage source −V through series-connected resistors R3 and R4. The drain electrode of MOSFET 42 is coupled via inductor L1 to a source of positive voltage +V. Suitable capacitors C2 through C5 serve in a bypass capacity for the various bias voltages.

MOSFET 42 and its associated circuitry act as a voltage-to-current converter circuit whereby the voltage from the input filter applied to the active MOSFET gate is converted to a current in the source-drain circuit. The inherent linearity of the MOSFET device assures accurate voltage to current conversion without generation of unwanted signal frequency harmonics. In addition, resistor R4 and capacitor C3 constitute a degenerative feedback path from the source electrode of MOSFET 42 to further enhance the linearity of the voltage-to-current conversion.

Current provided by MOSFET 42 is AC coupled via capacitor C6 to the commonly-connected emitter electrodes of transistors 43 and 44. These transistors are of the bipolar type, connected in push-pull relationship with their emitters coupled to the negative supply −V via resistor R5. The bases of transistors 43 and 44 are coupled to ground via inductors L2 and L3, respectively. The signal from local oscillator 16 (or the signal from local oscillator 28 in the case of mixer 27) is AC coupled to the base of transistor 43 via capacitor C7.

An adjustable inductance L4 is connected between the collectors of transistors 43 and 44. Another inductor L5 is connected in series with a current-limiting diode D1 between the source of positive voltage +V and the collector of transistor 43. Diode D1 is a current-limited diode, such as a 1N5293, across which a very small voltage drop appears in response to low and medium level currents therethrough but across which the voltage drop increases rapidly if the current therethrough increases beyond a predetermined threshold level. The junction of L5 and D1 is AC bypassed to ground by capacitor C8. Inductor L4 and capacitors C9, C10 and C11 correspond to a tank circuit which is tuned to the center frequency of bandpass filters 17 and 29 of FIG. 1. Inductor L4 serves as a trim component for purposes of proper tuning. The output signal from the circuit of FIG. 2 is taken from the collector of transistor 44 across a capacitive voltage divider circuit comprising capacitors C10 and C11. The signal to drive filters 17 and 29 appears at the junction of these two capacitors.

Transistors 43 and 44 are operated in a current steering mode whereby they are called upon only to steer signal current passed by capacitor C6 to the tank circuit. More particularly, transistors 43 and 44 are alternately driven into conduction and cut off, each in 180° phase displacement relative to the other, under the control of the local oscillator signal. The signal current thus passed by transistors 43 and 44 is alternately applied to the tank circuit in opposite polarities, depending upon which transistor is conducting at a particular time. Since the transistors are acting as current switches rather than amplifiers, the gains of the transistors do not effect the operating characteristics of this circuit. Rather, the transistor gains have only one requirement; namely that they be high. The converter is therefore not effected by temperature variations or other conditions which might change the gains of transistors 43 and 44.

The current-limiting action of diode D1 effectively limits the output voltage from the circuit when the input current level to transistors 43 and 44 is high. Specifically, the diode acts as a constant current source for high level signals only but does not effect operation for low and medium level signals below a predetermined current threshold value. The diode thus prevents overdriving filters 17 and 29 yet permits linear operation to ensue when the output power level from the frequency converter circuit is within the prescribed tolerance of the filters.

Resistor R5 serves to limit the bias applied to transistors 43 and 44 so that the local oscillator signal can have a frequency which is close to the output IF. If DC coupling were used between MOSFET 42 and transistors 43 and 44, the fact that the local oscillator signal resides close to the IF to which the tank circuit is tuned would result in unduly large amplitude swings. The reason for this is that MOSFET 42 requires a relatively large value of bias current, 8 ma, for optimum performance. Capacitor C6 is an AC coupling capacitor which allows separate biasing for MOSFET 42 and transistors 43 and 44.

Apart from the specific circuitry employed and described herein, a broad aspect of the present invention is the utilization of a voltage-to-current signal converter (42) and a current steering device (43, 44) to deliver the current to a tank circuit with the current automatically limited to a maximum value (by diode D1) to prevent overdriving of output circuitry. The resulting frequency converter is capable of: handling signal or local oscillator frequencies which are close to the intermediate frequency; providing linear mixing so that no undesired intermodulation distortion products are produced; and operating independently of active component characteristics.

Although the frequency converter described herein has been considered part of a specific piece of test equipment, it is to be understood that the frequency converter can be used in substantially any frequency conversion application, such as, for example, in radio, television and other communications receivers.

In a particular operating embodiment of the frequency converter of FIG. 2, the following component parameters were employed:

| | |
|---|---|
| R1 | 100 K ohms |
| R2 | 36 K ohms |
| R3 | 2.2 K ohms |
| R4 | 270 ohms |
| R5 | 27 K ohms |
| C1, C2, C4, C5, C7, C8 | .01 µf |
| C3, C6 | 0.1 µf |
| C9 | 36 pf |
| C10 | 43 pf |
| C11 | 300 pf |
| L1, L2, L5 | 1.0 mh |
| L3 | ferrite bead |
| L4 | adjustable |
| MOSFET 42 | 40822 |
| transistors 43, 44 | 2N3563 |
| D1 | 1N5293 |

While we have described and illustrated specific embodiments of our invention, it will be clear that variations of the details of construction which are specifically illustrated and described may be resorted to without departing from the true spirit and scope of the invention as defined in the appended claims.

We claim:

1. A frequency converter circuit responsive to a local oscillator signal and an input voltage signal for providing an output signal at a predetermined frequency, said circuit comprising:
   active means for converting said input voltage signal to a signal current having an amplitude proportional to the input voltage;
   circuit means tuned to said predetermined frequency;
   current steering means responsive to said local oscillator signal for alternately conducting said signal current via two paths to said circuits means;
   output means operable over a range of relatively low applied signal amplitudes;
   means for applying said output signal to said output means at an amplitude which is a function of the current conducted to said circuit means by said steering means; and
   current limiting diode means for limiting the maximum possible current through said steering means to a level which corresponds to an output signal amplitude residing within said range of relatively low amplitudes.

2. The circuit according to claim 1 further comprising degenerative feedback means for linearizing operation of said active means.

3. A frequency converter circuit responsive to a local oscillator signal and an input voltage signal for providing an output signal at a predetermined frequency, said circuit comprising:
   active means for converting said input voltage signal to a signal current having an amplitude proportional to the input voltage;
   circuit means tuned to said predetermined frequency;
   current steering means for alternately conducting said signal current via two paths to said circuit means; and
   means for limiting diode current to a predetermined amplitude through said current steering means;
   wherein said active means comprises a double-gate MOSFET having a source-drain current path, and wherein said input voltage is applied to one gate of said MOSFET and said signal current flows in said source-drain current path.

4. The circuit according to claim 3 wherein said current steering means comprises a pair of push-pull connected bipolar transistors having emitters connected together to receive said signal current, said transistors having a base wherein at least one base is connected to receive said local oscillator signal, said transistors additionally including collectors connected to said circuit means.

5. The circuit according to claim 4 wherein said current-limiting diode means is connected in series with said circuit means and each of said collectors.

6. The circuit according to claim 5 further comprising a capacitor coupling said signal current from said drain to said emitters.

7. A frequency converter circuit responsive to a local oscillator signal and an input voltage signal for providing an output signal at a predetermined frequency, said circuit comprising:

active means for converting said input voltage signal to a signal current having an amplitude proportional to the input voltage;

circuit means tuned to said predetermined frequency;

current steering means for alternately conducting said signal current via two paths to said circuits means; and means for limiting diode current to a predetermined amplitude through said current steering means;

wherein said current steering means comprises a pair of push-pull connected bipolar transistors having emitters connected together to receive said signal current, said transistors having a base wherein at least one base is connected to receive said local oscillator signal, said transistors additionally including collectors connected to said circuit means.

8. The circuit according to claim 7 wherein said means for limiting includes a current-limiting diode connected in series with said circuit means and each of said collectors.

* * * * *